United States Patent [19]

Olsson

[11] Patent Number: 4,558,397
[45] Date of Patent: Dec. 10, 1985

[54] INTERPOSER CONNECTOR FOR SURFACE MOUNTING A CERAMIC CHIP CARRIER TO A PRINTED CIRCUIT BOARD

[75] Inventor: Billy E. Olsson, New Cumberland, Pa.

[73] Assignee: AMP Incorporated, Harrisburg, Pa.

[21] Appl. No.: 562,773

[22] Filed: Dec. 19, 1983

[51] Int. Cl.[4] .......................................... H01R 23/72
[52] U.S. Cl. .............................. 361/404; 174/52 FP; 339/17 CF
[58] Field of Search ...... 339/17 CF, 176 M, 176 MP, 339/174, 17 N; 174/52 FP; 357/69, 70; 361/400–404

[56] References Cited

U.S. PATENT DOCUMENTS 3,311,790  3/1967  Vizzier, Sr. et al. ............... 339/174
4,376,560  3/1983  Olsson et al. .................... 339/17 CF

FOREIGN PATENT DOCUMENTS 2431816  1/1975  Fed. Rep. of Germany ... 339/17 CF

OTHER PUBLICATIONS

IPC-CM-78; Guidelines for Surface Mounting and Interconnecting Chip Carriers; Institute for Interconnecting and Packaging Electronic Circuits; 11-1983.

Primary Examiner—Neil Abrams
Attorney, Agent, or Firm—Adrian J. LaRue; Robert W. Pits

[57] ABSTRACT

An interposer connector for surface mounting a ceramic chip carrier to a printed circuit board comprises a dielectric base member having top planar surfaces and bottom surfaces formed as a series of rectangular projections, each of the projections having recesses therein. Electrical terminals have U-shaped contact sections, intermediate sections, and flat contact sections. The U-shaped contact sections are mounted onto respective projections and have dimples disposed in the recesses thereby securing the terminals onto the projections, the intermediate sections extend along outside surfaces of the base member and the flat contact sections extend along the top surfaces of the base member.

10 Claims, 5 Drawing Figures

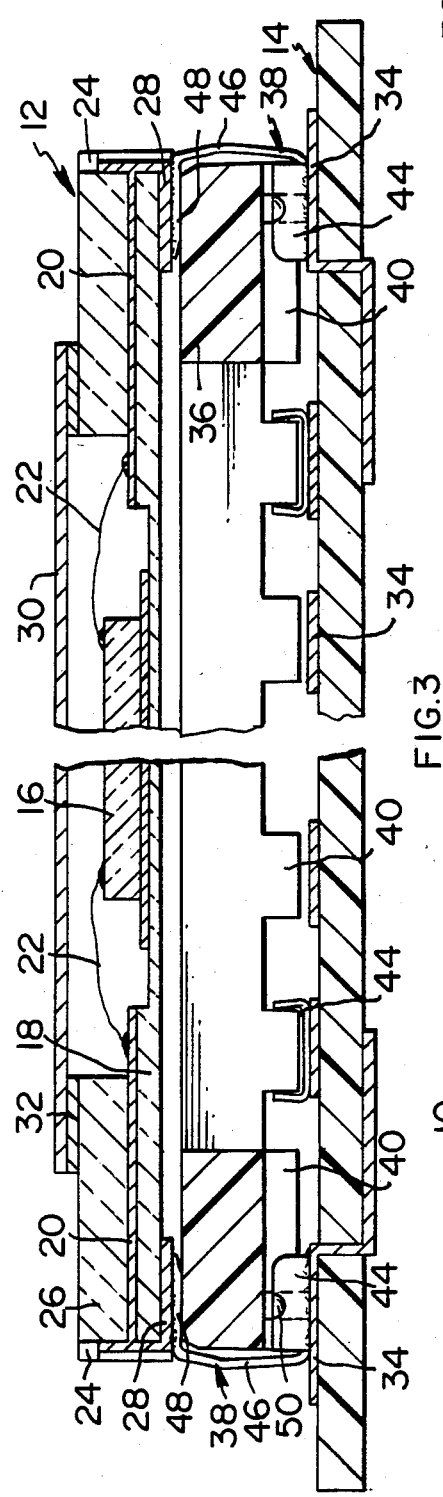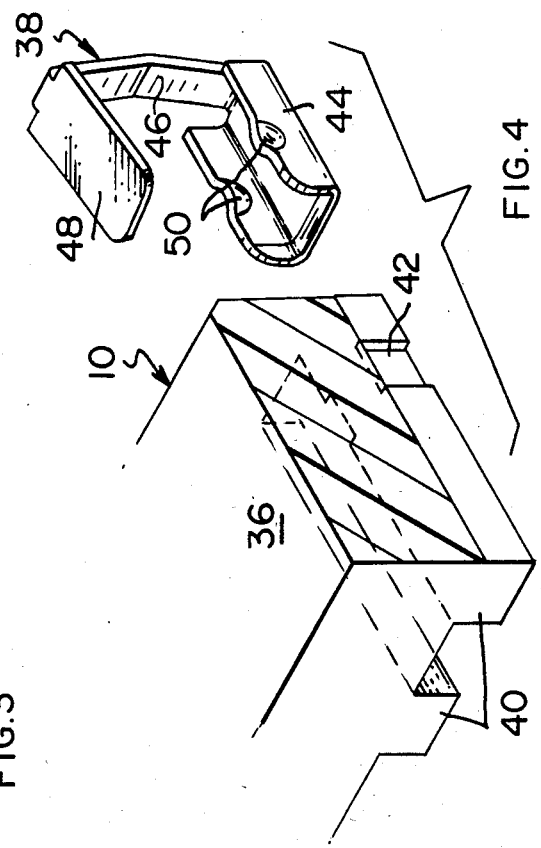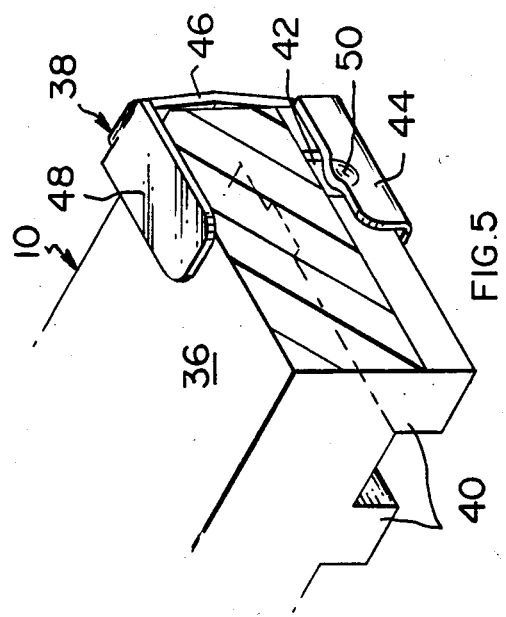

INTERPOSER CONNECTOR FOR SURFACE MOUNTING A CERAMIC CHIP CARRIER TO A PRINTED CIRCUIT BOARD

FIELD OF THE INVENTION

This invention relates to electrical connectors and more particularly to an interposer connector for surface mounting of a ceramic chip carrier to a printed circuit board.

BACKGROUND OF THE INVENTION

U.S. Pat. No. 4,376,560 discloses a socket for a leadless ceramic chip carrier. The socket includes a dielectric base member in which electrical terminals are mounted that are soldered to respective conductive pads on a printed circuit board. Spring contact sections of the terminals are electrically connected to respective conductive pads on the ceramic chip carrier which is held in engagement therewith via a lid that is rotatably mounted on the base member and is adjustable to accommodate a carrier which varies in height. Such socket is complicated and is expensive.

In the case of ceramic chip carriers that have twenty-eight or more conductive pads, they cannot be directly soldered to conductive pads of a printed circuit board because of the different coefficient of expansion of the two materials. The present invention solves this problem by use of an interposer connector that will compensate for expandion and contraction caused by temperature variations. Contrary to use of sockets, the present invention allows for direct and permanent soldering of the ceramic carrier to the printed circuit board by the interposer connector at a fraction of the cost of sockets.

SUMMARY OF THE INVENTION

According to the present invention, an interposer connector for surface mounting a ceramic chip carrier to a printed circuit board comprises a dielectric base member having top planar surfaces and bottom surfaces formed as a series of rectangular projections, each of the projections having recesses therein. Electrical terminals have U-shaped contact sections, intermediate sections, and flat contact sections. The U-shaped contact sections are mounted onto respective projections and have dimples disposed in the recesses thereby securing the terminals onto the projections, the intermediate sections extend along outside surfaces of the base member and the flat contact sections extend along the top surfaces of the base member.

BRIEF DESCRIPTION OF THE DRAWINGS

FIG. 3 is a cross-sectional view along line 3—3 of FIG. 2.

FIG. 4 is a cross-sectional view of a part of the base member with an electrical terminal exploded therefrom.

FIG. 5 shows the terminal mounted onto the base member.

DETAILED DESCRIPTION OF THE INVENTION

Figure 1:
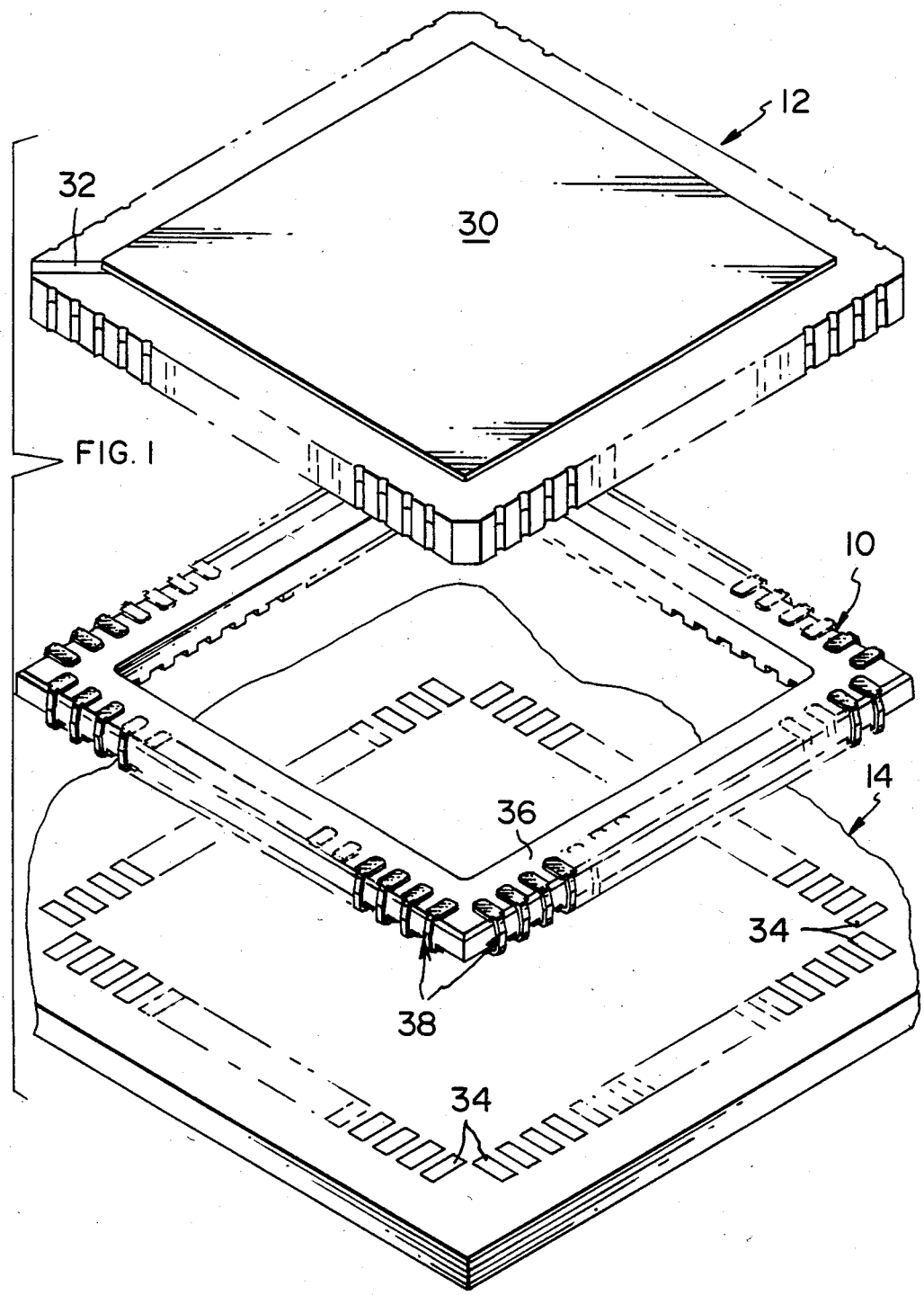
FIG. 1 is a perspective and exploded view of a part of a printed circuit board, an interposer connector, and a ceramic chip carrier.
Figure 2:
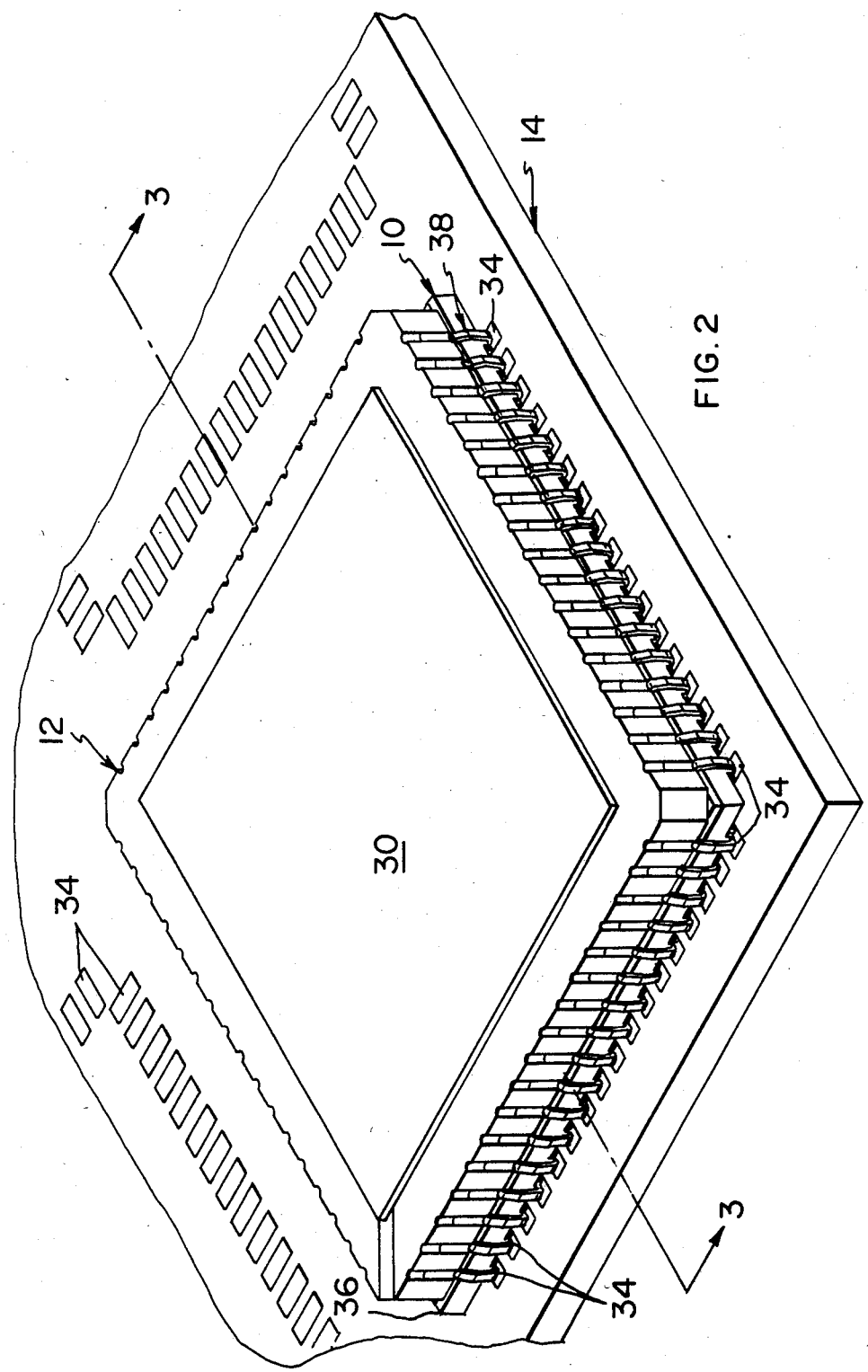
FIG. 2 is a view similar to FIG. 1 showing the interposer connector connecting the ceramic chip carrier to the printed circuit board.

An interposer connector 10 is shown in FIGS. 1-3 for surface connecting a ceramic chip carrier 12 to a printed circuit board 14. Ceramic chip carrier 12 is of conventional construction and includes, as shown in FIG. 3, an intergrated circuit chip 16 positioned on a base member 18 which has circuit paths 20 thereon. Electrical leads 22 are electrically connected between respective circuit paths 20 and pads on chip 16. Circuit paths 20 extend into grooves 24 in the sides of base member 18 and an upper frame 26 which is secured onto base member 18. Each of circuit paths 20 is disposed along a bottom surface of base member 18 in the form of conductive pads 28. A cover member 30 is secured onto frame 26 over ground conductor 32 to seal chip 16 within the ceramic chip carrier 12.

Printed circuit board 14 is of conventional construction and has a pattern of conductive pads 34 thereon corresponding to conductive pads 28 of chip carrier 12.

Interposer connector 10 comprises a dielectric frame member 36 and electrical terminals 38 secured along the sides thereof. Frame member 36 has a square or rectangular configuration corresponding to the configuration of ceramic chip carrier 12 and the array of conductive pads 34 on printed circuit board 14. Frame member 36 is molded from a suitable plastic material and has flat upper surfaces, whereas the bottom surfaces of frame member 36 are provided with projections 40 at spaced intervals therealong. Each of projections 40 has recesses 42 disposed in the sides opposite each other as shown in FIGS. 4 and 5. The outside surfaces of frame members 36 extending between projections 40 and the top surfaces thereof are slightly tapered as shown in FIGS. 3, 4 and 5.

Electrical terminals 38 are stamped and formed from metal strips having the desired spring characteristics and they include a U-shaped contact section 44, intermediate section 46, and flat contact section 48. The legs of U-shaped contact section 44 have inwardly-directed dimples 50 disposed therein which mate with respective recesses 42 in projections 40 when contact sections 44 are positioned thereon. Flat contact sections 48 are slightly bent downwardly and intermediate section 46 have a slight bend therein as shown in FIGS. 3-5. Electrical terminals 38 are held in position on frame 36 by flat contact sections 48 engaging the upper surfaces of frame 36, intermediate sections 46 extend along the sides and contact sections 44 are disposed on respective projections 40 with dimples 50 being disposed in respective recesses 42 thereof. With electrical terminals 30 secured in position on frame 36 along the respective sides thereof, interposer connector 10 can now be used to connect ceramic chip carrier 12 to printed circuit board 14 in accordance with surface mounting practices.

The legs of contact sections 44 of electrical terminals 38 taper inward slightly so as to make certain that dimples 50 are disposed in recesses 42. The tapered sides of frame member 36 enables frame member 36 and board 14 to expand without placing undue stresses on electrical terminals 38 so as not to interrupt the soldered connections between contact sections 48 and conductive pads 28 of ceramic chip carrier 12 due to the differential coefficient of expansion between the ceramic chip carrier 12, frame member 36, and printed circuit board 14. The slots formed between projections 40 of frame member 36 allow for washing away flux residue subsequent to soldering. The thickness of interposer connector 10 allows for a short lead length thereby resulting in less inductance. The interposer connector comes completely assembled so that all the user has to do is place the connector in its proper location on the printed circuit board without further operations.

Contact sections 44 and 48 of electrical terminals 38 can be supplied with a generous coating of tin which, when brought to solder temperature, will cause the tin to reflow and thereby solder contact sections 44 to respective pads 34 on printed circuit board 14 and contact sections 48 to be soldered to respective conductive pads 28 of ceramic chip carrier 12 thereby resulting in surface mounting of a chip carrier to a printed circuit board.

Alternatively, solder paste can be screened onto conductive pads 34 of printed circuit board 14, contact sections 44 of connector 10 can then be positioned onto the solder paste coated conductive pads 34 whereafter solder paste can be screened onto contact sections 48 or conductive pads 28 of chip carrier 12 to position chip carrier 12 onto connector 10 whereafter, via reflow soldering practices, conductive pads 28 are soldered to contact sections 48 and contact sections 44 are soldered to conductive pads 34.

Intermediate sections 46 of electrical terminals 38 can bend back and forth, move up and down, and move sideways to accommodate for temperature variation to maintain the integrity of the soldered connections between contact sections 44 and conductive pads 34 and contact sections 48 and conductive pads 28.

Electrical terminal 38 can be stamped and formed in continuous strip form on 50-mil centers with two strips disposed on opposite sides of frame member 36 so as to be simultaneously mounted in position thereon whereafter two strips are disposed on the remaining opposite sides of frame member 36 whereafter terminals are 38 secured in position thereon thereby resulting in a completed connector 10.

I claim:

1. An interposer connector for surface mounting of a ceramic chip carrier to a printed circuit board which comprises a dielectric base member having electrical terminals secured on the sides of the base member with first contact sections comprising means for soldered electrical connection with respective conductive pads of a printed circuit board and second contact sections for electrical connection with respective conductive pads of the ceramic chip carrier, characterized in that:
    said base member has bottom surfaces provided with a plurality of adjacent projections along at least one side separated by slots formed between adjacent projections;
    said first contact sections are U-shaped and are mounted on respective ones of said projections;
    said second contact sections are flat and extend along and engage planar surfaces of said base member; and
    intermediate sections connect the first and second contact sections and extend along said sides of the base member.

2. An interposer connector as set forth in claim 1, characterized in that said projections have recesses in side surfaces thereof and legs of the U-shaped contact sections have dimples disposed in said recesses.

3. An interposer connector as set forth in claim 1, characterized in that sides of said base member are slightly tapered and spaced from said intermediate sections and said intermediate sections are slightly bent.

4. An interposer connector as set forth in claim 1, characterized in that said base member is a rectangular frame member.

5. An electrical connector for surface mounting of a ceramnic chip carrier to a printed circuit board, comprising:
    a dielectric frame base member having top flat surfaces and bottom surfaces including a plurality of adjacent projections along at least one side separated by slots formed between adjacent projections;
    electrical terminals having U-shaped contact sections, flat contact sections and intermediate sections connecting said U-shaped contact sections and said flat contact sections together;
    said flat contact sections engaging said top flat surfaces while said U-shaped contact sections are mounted onto respective ones of said projections and said intermediate sections extend along said sides of said base member.

6. An electrical connector as set forth in claim 5, wherein said projections have recesses in side surfaces thereof and the legs of said U-shaped contact sections have dimples disposed in said recesses.

7. An electrical connector as set forth in claim 5, wherein said intermediate sections are slightly bent and the side surfaces of said base member are slightly tapered and spaced from said intermediate sections.

8. An electrical connector as set forth in claim 5, wherein said base member is a rectangular frame member.

9. An interposer connector for surface mounting of a ceramic chip carrier to a printed circuit board which comprises a dielectric base member having electrical terminals secured on the sides of the base member with first contact sections comprising means for soldered electrical connection with respective conductive pads of a printed circuit board and second contact sections for electrical connection with respective conductive pads of the ceramic chip carrier, characterized in that:
    said base member has bottom surfaces having a plurality of adjacent projections along at least one side separated by slots formed between adjacent projections;
    said first contact sections are U-shaped and are mounted on respective ones of said projections;
    said second contact sections are flat and extend along and engage planar surfaces of said base member; and
    intermediate sections connect the first and second contact sections and extend along said sides of the base member.

10. An interposer connector for surface mounting of a ceramic chip carrier to a printed circuit board which comprises a dielectric base member having electrical terminals secured to the sides of the base member with first contact sections for soldered electrical connection with respective conductive pads of a printed circuit board and second contact sections for electrical connection with respective conductive pads of the ceramic chip carrier, characterized in that:
    said base member including an elongated member having a top planar surface, a bottom surface provided with a row or projections spaced apart along a first axis and a side surface joining said top and bottom surfaces, the projections each having sides which are oppositely directed and extend transversely across said first axis;

said first contact sections are U-shaped and are mounted on respective projections, the U-shaped contact sections each including free ended legs for mounting the terminals on the projections alongside and in engagement with said side faces;

said second contact sections are flat and extend along planar surfaces of said base member; and intermediate sections connect the first and second contact sections and extend along the sides of the base member.

* * * * *